(12) United States Patent
Goitsuka (10) Patent No.: US 12,512,263 B2
(45) Date of Patent: Dec. 30, 2025

(54) CERAMIC ELECTRONIC COMPONENT

(71) Applicant: Murata Manufacturing Co., Ltd., Nagaokakyo (JP)

(72) Inventor: Takuya Goitsuka, Nagaokakyo (JP)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 118 days.

(21) Appl. No.: 18/654,216

(22) Filed: May 3, 2024

(65) Prior Publication Data

US 2024/0282519 A1    Aug. 22, 2024

Related U.S. Application Data

(63) Continuation of application No. PCT/JP2022/045629, filed on Dec. 12, 2022.

(30) Foreign Application Priority Data

Dec. 17, 2021    (JP) .................. 2021-205381

(51) Int. Cl.
*H01G 2/24* (2006.01)
*H01G 4/12* (2006.01)

(52) U.S. Cl.
CPC ............. *H01G 2/24* (2013.01); *H01G 4/1209* (2013.01)

(58) Field of Classification Search
CPC ........ H01G 2/24; H01G 4/1209; H01G 4/232; H01G 4/30; H01C 1/04; H01F 27/00
See application file for complete search history.

(56) References Cited

U.S. PATENT DOCUMENTS

| | | | |
|---|---|---|---|
| 8,179,225 B2 | 5/2012 | Iguchi et al. | |
| 8,420,209 B2 | 4/2013 | Motoya et al. | |
| 2006/0158824 A1* | 7/2006 | Kawajiri | H01G 4/40 361/272 |
| 2009/0207554 A1 | 8/2009 | Iguchi et al. | |
| 2012/0003450 A1* | 1/2012 | Motoya | C04B 35/195 428/213 |
| 2018/0061551 A1* | 3/2018 | Kondou | H01F 27/323 |
| 2018/0315545 A1* | 11/2018 | Kusumoto | H01F 27/28 |
| 2024/0153703 A1* | 5/2024 | Oie | H01G 4/33 |
| 2024/0194404 A1* | 6/2024 | Oie | H01G 2/24 |

(Continued)

FOREIGN PATENT DOCUMENTS

| | | |
|---|---|---|
| JP | S60-170922 A | 9/1985 |
| JP | H11-121887 A | 4/1999 |

(Continued)

OTHER PUBLICATIONS

International Search Report received for PCT Patent Application No. PCT/JP2022/045629, mailed on Feb. 21, 2023, 2 pages (English Translation Only).

*Primary Examiner* — Dion R. Ferguson
(74) *Attorney, Agent, or Firm* — ArentFox Schiff LLP (57) ABSTRACT

A ceramic electronic component that includes: an element body containing ceramic as main material thereof; and an identification mark on a surface of element body, wherein the element body includes: a first layer containing a specific compound containing barium and silicon; and a second layer that contains the specific compound, is interposed between the identification mark and the first layer, and has a proportion of the specific compound lower than a proportion of the specific compound in the first layer.

11 Claims, 9 Drawing Sheets

(56) References Cited

U.S. PATENT DOCUMENTS

| | | | |
|---|---|---|---|
| 2024/0249861 A1* | 7/2024 | Oie | H01C 1/04 |
| 2024/0282519 A1* | 8/2024 | Goitsuka | H01G 2/24 |
| 2024/0321516 A1* | 9/2024 | Goitsuka | H01C 1/04 |
| 2025/0037937 A1* | 1/2025 | Oie | H01G 4/30 |

FOREIGN PATENT DOCUMENTS

| | | | | |
|---|---|---|---|---|
| JP | 2003007573 A | * | 1/2003 | |
| JP | 2009-200168 A | | 9/2009 | |
| JP | 2012-015433 A | | 1/2012 | |
| JP | 5263226 B2 | | 8/2013 | |
| WO | WO-2012157436 A1 | * | 11/2012 | H05K 3/4007 |
| WO | WO-2024116677 A1 | * | 6/2024 | H01F 27/29 |

* cited by examiner

CERAMIC ELECTRONIC COMPONENT

CROSS REFERENCE TO RELATED APPLICATIONS

The present application is a continuation of International application No. PCT/JP2022/045629, filed Dec. 12, 2022, which claims priority to Japanese Patent Application No. 2021-205381, filed Dec. 17, 2021, the entire contents of each of which are incorporated herein by reference.

TECHNICAL FIELD

The present description relates to a ceramic electronic component including an element body mainly made of ceramic and an identification mark formed on the element body.

BACKGROUND ART

A multilayer ceramic substrate as an example of a ceramic electronic component mainly made of ceramic is disclosed in Patent Document 1. In the multilayer ceramic substrate, first ceramic layers and second ceramic layers thinner than the first ceramic layers are alternately laminated. Each of the first ceramic layers and the second ceramic layers contains celsian ($BaAl_2Si_2O_8$). The celsian improves mechanical properties, electrical insulation, and the like of the ceramic electronic component. Usually, celsian crystals are randomly scattered inside the ceramic electronic component.

Patent Document 2 discloses an example of a ceramic electronic component in which an identification mark is formed on a surface of an element body mainly made of ceramic. The identification mark is for identifying a direction of the ceramic electronic component. The identification mark of the ceramic electronic component disclosed in Patent Document 2 is made of a porcelain material.

Patent Document 1: JP-B2-5263226
Patent Document 2: JP-A-S60-170922

SUMMARY OF THE DESCRIPTION

A ceramic electronic component in which an identification mark is formed on an element body containing celsian has the following problems.

Usually, a ceramic electronic component is manufactured by singulating a wafer in which a plurality of element bodies are arranged. As described above, the celsian crystals are randomly scattered inside the ceramic electronic component. When the celsian is unevenly scattered in the wafer, the density of the celsian included in each of the plurality of element bodies varies.

The identification mark formed on the element body is sintered to the element body by being fired together with the element body. At this time, the sinterability of the identification mark with respect to the element body decreases as the density of celsian included in the element body increases. When the sinterability of the identification mark with respect to the element body decreases, the visibility of the identification mark with respect to the element body may decrease. Here, in a case where the density of the celsian varies as described above, sinterability of the identification mark with respect to the element body varies in the plurality of element bodies arranged on the wafer. That is, sinterability and visibility of the identification mark formed on the element body having a low density of celsian are high with respect to the element body, while sinterability and visibility of the identification mark formed on the element body having a high density of celsian are low with respect to the element body.

Therefore, an object of the present description is to solve the above problems, and to provide a ceramic electronic component capable of maintaining high sinterability of an identification mark with respect to an element body.

In order to achieve the above object, the present description is configured as follows. A ceramic electronic component according to an aspect of the present description includes: an element body containing ceramic as a main material thereof; and an identification mark on a surface of the element body, in which the element body includes: a first layer containing a specific compound containing barium and silicon; and a second layer that contains the specific compound, is interposed between the identification mark and the first layer, and has a proportion of the specific compound lower than a proportion of the specific compound in the first layer.

According to the present description, the sinterability of the identification mark with respect to the element body can be maintained at a high level.

DETAILED DESCRIPTION OF THE PREFERRED EMBODIMENTS

A ceramic electronic component according to an aspect of the present description includes: an element body containing ceramic as a main material thereof; and an identification mark on a surface of the element body, in which the element body includes: a first layer containing a specific compound containing barium and silicon; and a second layer that contains the specific compound, is interposed between the identification mark and the first layer, and has a proportion of the specific compound lower than a proportion of the specific compound in the first layer.

According to this configuration, a proportion of the specific compound contained in the second layer close to the identification mark is lower than a proportion of the specific compound contained in the first layer away from the identification mark. The specific compound contains barium and silicon, and is, for example, celsian (Alumina (aluminum oxide) is contained in addition to barium and silicon.) or fresnoite (Titanium oxide is contained in addition to barium and silicon.). As a result, in this configuration, the sinterability of the identification mark with respect to the element body can be maintained at a high level as compared with the configuration in which the element body does not include the second layer. Furthermore, since the sinterability of the identification mark with respect to the element body is maintained at a high level, the visibility of the identification mark with respect to the element body is improved.

In the ceramic electronic component, the element body may contain celsian as the main material thereof, and the identification mark may contain alumina as a main material thereof.

According to this configuration, the identification mark contains alumina as a main material. Here, at an interface with alumina in the element body and a peripheral portion thereof, celsian is less likely to be crystallized. Therefore, when the identification mark containing alumina as a main material is formed on a surface of the element body containing celsian and the element body is fired together with the identification mark, a density of celsian in the peripheral portion of the identification mark in the element body is lower than a density of celsian in other portions other than the peripheral portion in the element body. The peripheral portion corresponds to the second layer, and the other portions correspond to the first layer. That is, according to this configuration, the element body including the first layer and the second layer can be easily manufactured.

In the ceramic electronic component, a thickness of the second layer may be the same as or substantially the same as a maximum thickness of the identification mark.

In a case where the thickness of the second layer is smaller than the maximum thickness of the identification mark, that is, in a case where a portion of the identification mark contributing to the improvement of the sinterability with respect to the second layer is thin, there is a possibility that the sinterability of the identification mark with respect to the second layer is deteriorated. In a case where the thickness of the second layer is larger than the maximum thickness of the identification mark, that is, in a case where a volume of the portion where a proportion of the specific compound is low is large, a proportion of the specific compound in the entire element body may decrease, leading to deterioration of the mechanical properties, electrical insulation, and the like of the ceramic electronic component. According to this configuration, the thickness of the first layer is the same as or substantially the same as the maximum thickness of the identification mark. This makes it possible to suppress a decrease in the proportion of the specific compound in the entire element body while suppressing a decrease in the sinterability of the identification mark with respect to the second layer.

In the ceramic electronic component, the element body may include an electrode interposed between the first layer and the second layer.

According to this configuration, in a case where the second layer is formed in a manufacturing process of the element body, excessive expansion of a formation range of the second layer can be prevented by the electrode.

Embodiment

Figure 1:
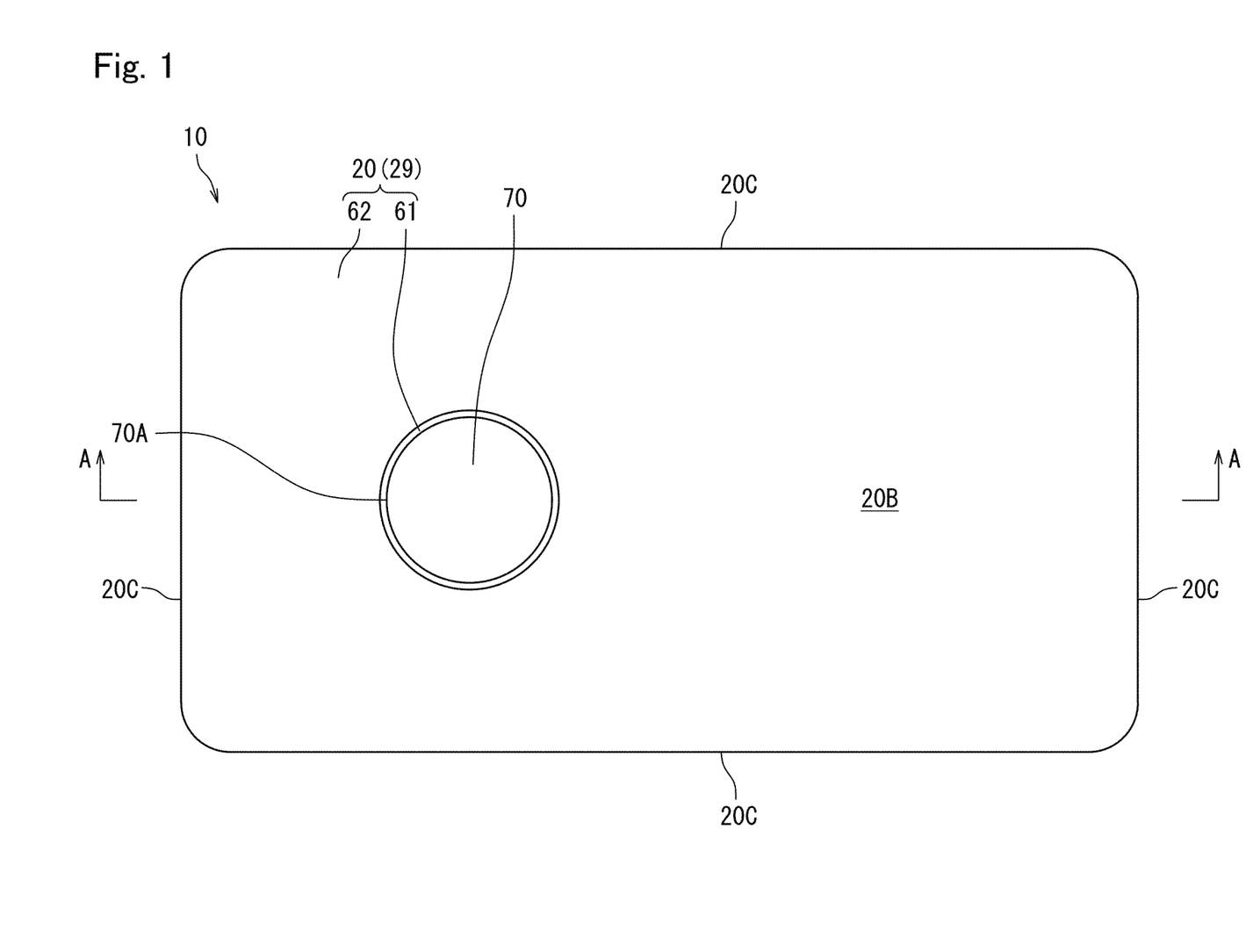
FIG. 1 is a plan view of a ceramic electronic component according to an embodiment of the present description.
Figure 2:
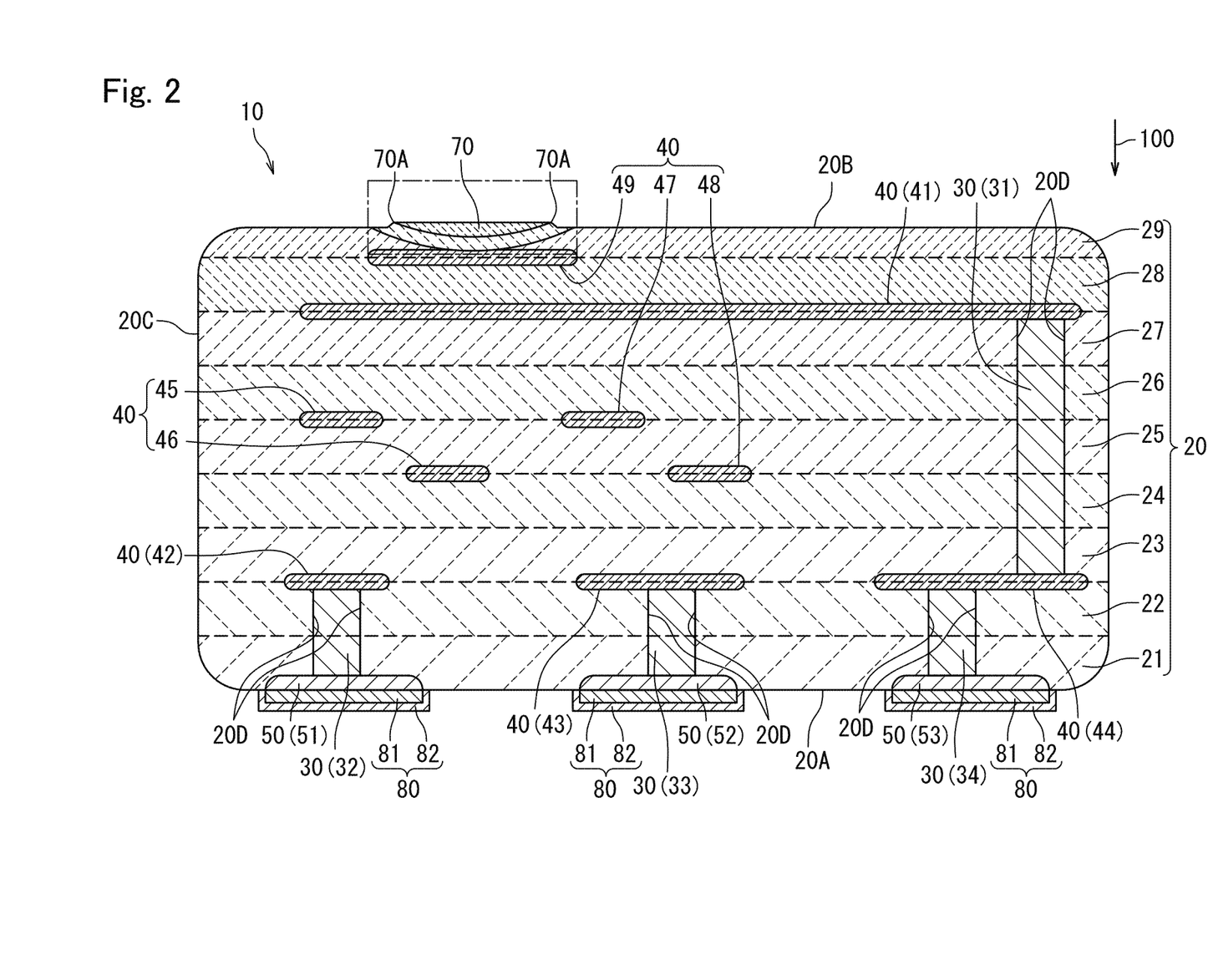
FIG. 2 is a cross-sectional view illustrating an A-A cross section of FIG. 1.
Figure 3:
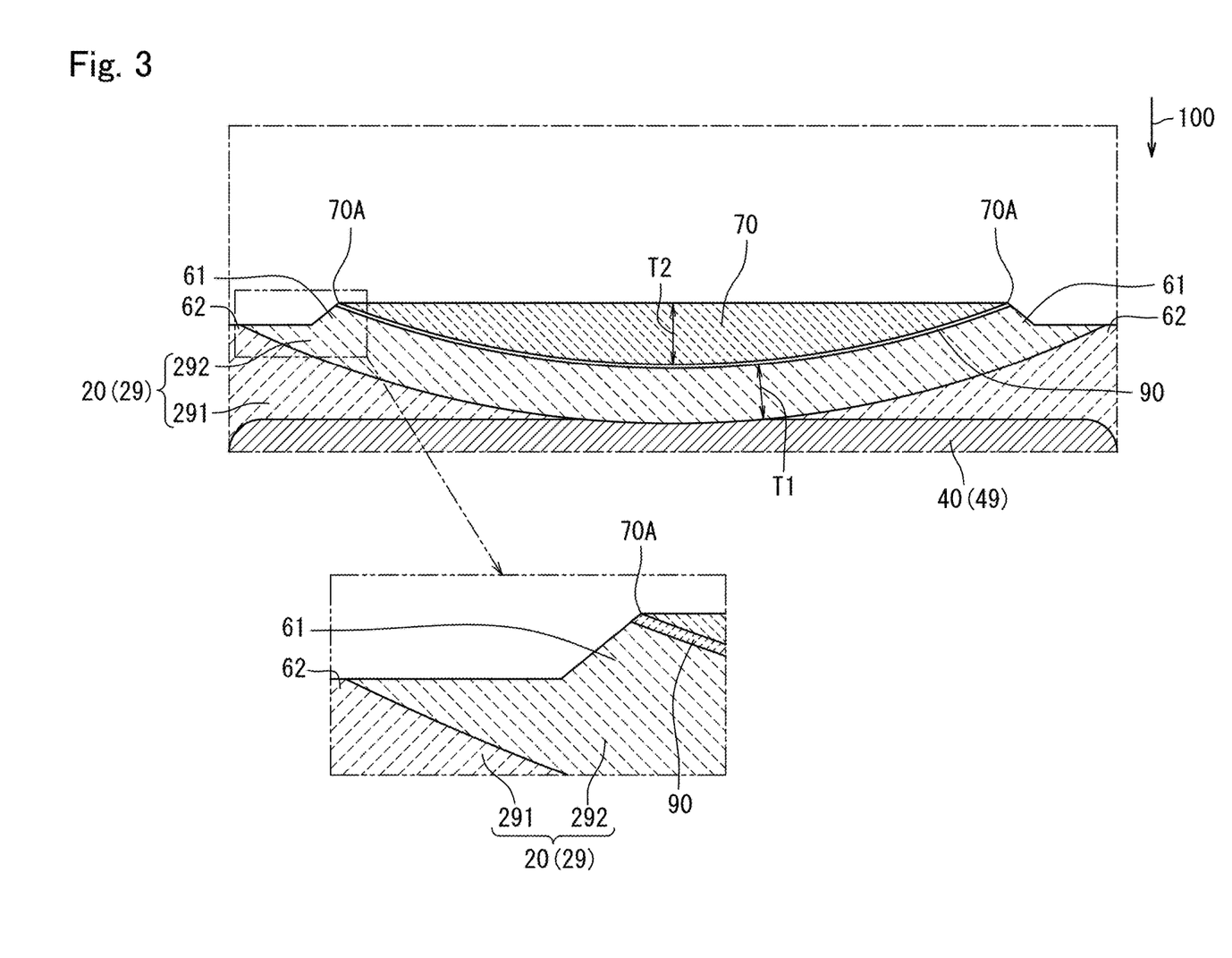
FIG. 3 is an enlarged view of an alternate long and short dash line portion in FIG. 2.

FIG. 1 is a plan view of a ceramic electronic component according to an embodiment of the present description. FIG. 2 is a cross-sectional view illustrating an A-A cross section of FIG. 1. FIG. 3 is an enlarged view of an alternate long and short dash line portion in FIG. 2. The ceramic electronic component includes an element body provided with an identification mark. In the ceramic electronic component according to the present embodiment, for example, an interlayer connection conductor, an internal electrode, an external electrode, and a plating layer are provided on the element body in addition to the identification mark. The ceramic electronic component can be mounted on a mother substrate or the like via the external electrode.

As illustrated in FIGS. 1 and 2, a ceramic electronic component 10 according to the present embodiment includes an element body 20, an interlayer connection conductor 30, an internal electrode 40, an external electrode 50, an identification mark 70, and a plating layer 80.

The element body 20 has a rectangular parallelepiped shape as a whole. The shape of the element body 20 is not limited to a rectangular parallelepiped shape. In the present embodiment, the element body 20 is formed by integrating base materials 21 to 29 laminated in a thickness direction 100. That is, in the present embodiment, the element body 20 is formed by integrating nine base materials. The number of base materials constituting the element body 20 is not limited to nine. Each of the base materials 21 to 29 is insulating and has a plate shape.

The element body 20 contains ceramic as a main material. The main material of the element body 20 is a material having the highest proportion among a plurality of types of materials included in the element body 20. In a case where the element body 20 includes one kind of material, the one kind of material constituting the element body 20 is the main material of the element body 20. The definition of the main material is the same for other than the element body 20. For example, the main material of the identification mark 70 is a material having the highest proportion among a plurality of types of materials included in the identification mark 70.

In the present embodiment, the element body 20 (each of the base materials 21 to 29) contains a filler that is a main material and determines dielectric properties, a glass material, and an additive for adjusting physical properties such as a shrinkage factor. The proportion of each material contained in the element body 20 is, for example, about 60% for the filler, about 10% for the glass material, and about 30% for the additive. The filler and the additive contain aluminum (Al) (for example, alumina), magnesium (Mg), silicon (Si), barium (Ba), titanium (Ti), zirconium (Zr) (for example, zirconia), and the like. In the present embodiment, the element body 20 contains celsian ($BaAl_2Si_2O_8$). The celsian contains barium and silicon. The celsian is an example of the specific compound.

Note that, as long as a condition that the main material is ceramic is satisfied, the material contained in the element body 20 is not limited to the above-described one, and the proportion of each material contained in the element body 20 is not limited to the above-described proportion. Furthermore, the filler and the additive may contain substances other than the above-mentioned substances. Furthermore, in the present embodiment, the element body 20 contains celsian crystals, but may contain other crystals. For example, the element body 20 may contain fresnoite (for example, $Ba_2TiSi_2O_8$ or $Ba_2TiGe_2O_8$) instead of celsian. In this case, the fresnoite corresponds to a specific compound containing barium and silicon.

As illustrated in FIG. 2, the element body 20 includes a pair of principal surfaces 20A and 20B and a side surface 20C. The principal surface 20A is a principal surface of the base material 21 and faces the outside of the element body 20. The principal surface 20B is a principal surface of the base material 29 and faces the outside of the element body 20. The principal surface 20B faces opposite to the principal surface 20A. The principal surface 20B is an example of a surface of the element body 20. The side surface 20C is configured by a side surface of the base materials 21 to 29. The side surface 20C connects the principal surfaces 20A and 20B.

In the present embodiment, the pair of principal surfaces 20A and 20B is orthogonal to the thickness direction 100. The plan view of FIG. 1 is a view of the ceramic electronic component 10 as viewed in the thickness direction 100 (see FIG. 2). Furthermore, in the present embodiment, a length in a longitudinal direction of the principal surfaces 20A and 20B is 2 to 4 mm, a length in a lateral direction of the principal surfaces 20A and 20B is 1 to 2 mm, and a length in the thickness direction 100 of the element body 20 is 45 to 1000 µm. Note that each of the lengths is not limited to the length described above.

As illustrated in FIGS. 1 and 2, the element body 20 includes a first portion 61 and a second portion 62. Furthermore, as illustrated in FIG. 3, a diffusion layer 90 is formed in the element body 20. Furthermore, as illustrated in FIG. 3, the base material 29 of the element body 20 includes a first layer 291 and a second layer 292. The first portion 61, the second portion 62, the diffusion layer 90, the first layer 291, and the second layer 292 will be described later.

As illustrated in FIG. 2, the interlayer connection conductor 30 is formed inside the element body 20. The interlayer connection conductor 30 can be formed on at least one of the base materials 21 to 29. In the present embodiment, the interlayer connection conductor 30 is formed on the base materials 21 to 27.

The interlayer connection conductor 30 is formed by filling a through hole 20D penetrating at least one of the plurality of base materials 21 to 29 in the thickness direction 100 with a conductive paste, and co-firing the conductive paste with the element body 20 containing ceramic as a main material. The conductive paste contains, for example, a conductive powder such as copper. The conductive powder contained in the conductive paste is not limited to copper, and may be, for example, silver. In the present embodiment, since the through hole 20D has a cylindrical shape, the interlayer connection conductor 30 has a cylindrical shape. The shape of the through hole 20D is not limited to the cylindrical shape, and may be, for example, a shape such as a quadrangular prism.

In FIG. 2, the interlayer connection conductor 30 includes four interlayer connection conductors 31 to 34. The interlayer connection conductor 31 is filled in the through hole 20D penetrating the base materials 23 to 27. Each of the interlayer connection conductors 32 to 34 is filled in the through hole 20D penetrating the base materials 21 and 22. The length of each of the interlayer connection conductors 31 to 34 in the thickness direction 100 (the number of base materials penetrating therethrough) is not limited to the length described above.

The internal electrode 40 is formed inside the element body 20 and is not exposed to the outside of the element body 20. The internal electrode 40 can be formed on at least one of the base materials 21 to 29. In the present embodiment, the internal electrode 40 is formed on the base materials 22, 24, 25, 27, and 28.

In a case where the main material of the element body 20 is ceramic as in the present embodiment, the internal electrode 40 is obtained by printing a conductive paste on the principal surface of the base material (each of the base materials 22, 24, 25, 27, and 28 in the present embodiment) and co-firing the paste with the base material. The conductive paste contains, for example, copper or silver.

In the present embodiment, the internal electrode 40 includes nine internal electrodes 41 to 49. The internal electrode 41 is formed on the base material 27. The internal electrodes 42 to 44 are formed on the base material 22 (see FIG. 3). The internal electrodes 45 and 47 are formed on the base material 25. The internal electrodes 46 and 48 are formed on the base material 24. The internal electrode 49 is formed on the base material 28. The internal electrode 49 is an example of an electrode.

Each of the internal electrodes 40 is electrically connected to another internal electrode 40 or the external electrode 50. In the present embodiment, as illustrated in FIG. 2, the internal electrode 41 is electrically connected to the internal electrode 44 via the interlayer connection conductor 31. The internal electrode 42 is electrically connected to an external electrode 51 via the interlayer connection conductor 32. The internal electrode 43 is electrically connected to an external electrode 52 via the interlayer connection conductor 33. The internal electrode 44 is connected to the internal electrode 41 via the interlayer connection conductor 31, and is electrically connected to an external electrode 53 via the interlayer connection conductor 34.

The external electrode 50 is formed outside the element body 20. That is, the external electrode 50 is exposed to the outside of the element body 20. In the present embodiment, the external electrode 50 is formed on the principal surface of the base material 21 (principal surface 20A of the element body 20). Note that the external electrode 50 may be formed on at least one of the principal surface 20B of the element body 20 and the side surface 20C of the element body 20 instead of the principal surface 20A of the element body 20 or in addition to the principal surface 20A of the element body 20.

The external electrode 50 is configured in the same manner as the internal electrode 40. That is, in the present embodiment, the external electrode 50 is obtained by printing a conductive paste on the principal surface 20A of the element body 20 and co-firing the paste with the base materials 21 to 29. In the present embodiment, the external electrode 50 includes three external electrodes 51 to 53.

As described above, the external electrode 51 is electrically connected to the internal electrode 42 via the interlayer connection conductor 32, the external electrode 52 is electrically connected to the internal electrode 43 via the interlayer connection conductor 33, and the external electrode 53 is electrically connected to the internal electrode 44 via the interlayer connection conductor 34.

The identification mark 70 is formed on the principal surface 20B of the element body 20. The identification mark 70 is for indicating an attitude and a direction of the ceramic electronic component 10.

In the present embodiment, the ceramic electronic component 10 includes one identification mark 70, but may include a plurality of the identification marks 70.

In the present embodiment, as illustrated in FIG. 1, the identification mark 70 has a circular shape when viewed in the thickness direction 100, but is not limited to a circular shape. Furthermore, in the present embodiment, a diameter of the identification mark 70 viewed from the thickness direction 100 is 100 to 150 μm, but the diameter is not limited to 100 to 150 μm.

As illustrated in FIGS. 2 and 3, a part of the identification mark 70 is embedded in the base material 29 of the element body 20. On the other hand, the remaining portion (in other words, the portion excluding the part) of the identification mark 70 protrudes from the principal surface 20B of the element body 20.

Note that the identification mark 70 may not be embedded in the element body 20. In this case, the entire identification mark 70 protrudes from the principal surface 20B of the element body 20. That is, it is sufficient that at least a part of the identification mark 70 protrudes from the principal surface 20B of the element body 20.

In each drawing, the color of the identification mark 70 is indicated by white or hatching, but the color of the identification mark 70 is not limited to white, and may be other colors such as black, gray, and red. The color of the identification mark 70 is preferably a color different from that around the identification mark 70 (the base material 29 in the present embodiment).

In the present embodiment, the identification mark 70 contains ceramic as a main material, and contains alumina as a main material and a glass material. The proportion of each material contained in the identification mark 70 is about 75% for alumina and about 25% for the glass material. In the present embodiment, the proportion of the glass material contained in the identification mark 70 is larger than the proportion of the glass material contained in the element body 20. Furthermore, in the present embodiment, a thermal shrinkage rate of the identification mark 70 is lower than a thermal shrinkage rate of the element body 20. For example, the element body 20 is adjusted so that the thermal shrinkage rate is lower than that of the identification mark 70 by the above-described additive. Furthermore, for example, the element body 20 contains as a main material a material (for example, zirconia ($ZrO_2$)) having a thermal shrinkage rate lower than that of alumina, which is a main material of the identification mark 70. The identification mark 70 may be non-shrunk at least at a temperature when fired.

Note that the material of the identification mark 70 is arbitrary on condition that the material has high distinguishability (high visibility) from those around the identification mark 70 (the base material 29 in the present embodiment). For example, the identification mark 70 may contain resin, metal, or the like as a main material. That is, the main material of the identification mark 70 may be other than ceramic. Furthermore, a proportion of the glass material contained in the identification mark 70 may be less than or equal to a proportion of the glass material contained in the element body 20. Furthermore, the identification mark 70 may not contain the glass material. Furthermore, the identification mark 70 may contain a coloring material for making the identification mark 70 different in color from the base material 29.

As illustrated in FIGS. 1 and 3, the element body 20 includes the first portion 61 and the second portion 62.

The first portion 61 is a portion of the element body 20 that surrounds the identification mark 70 and is in contact with an outer edge portion 70A of the identification mark 70 as viewed in the thickness direction 100. The outer edge portion 70A of the identification mark 70 is a portion including an outer edge of the identification mark 70 and the vicinity of the outer edge when viewed from the thickness direction 100. In the present embodiment, as viewed in the thickness direction 100, the first portion 61 is an annular portion formed in the vicinity of the identification mark 70 (see FIG. 1).

The second portion 62 is a portion of the element body 20 surrounding the first portion 61 as viewed in the thickness direction 100. That is, the second portion 62 is a portion outside the first portion 61 as viewed in the thickness direction 100. In the present embodiment, the second portion 62 is in contact with an outer edge portion of the first portion 61. The outer edge portion of the first portion 61 is a portion including an outer edge of the first portion 61 and the vicinity of the outer edge as viewed in the thickness direction 100. As described above, when viewed from the thickness direction 100, the first portion 61 is sandwiched between the second portion 62 and the identification mark 70.

As illustrated in FIG. 3, the first portion 61 is raised with respect to the second portion 62. In the present embodiment, a height of the ridge of the first portion 61 with respect to the second portion 62, in other words, a protrusion length of the first portion 61 from the second portion 62 in the thickness direction 100 is 4 μm. Note that the height of the ridge of the first portion 61 with respect to the second portion 62 is not limited to 4 μm.

In the present embodiment, the height of the ridge of the first portion 61 is the same as or substantially the same as a height of a protruding distal end portion of the identification mark 70. In other words, in a protruding direction of the identification mark 70 with respect to the element body 20, the ridge distal end portion of the first portion 61 and the protruding distal end portion of the identification mark 70 are at the same position or substantially the same position.

Note that the height of the ridge of the first portion 61 may be lower than the height of the protruding distal end portion of the identification mark 70 or may be higher than the height of the protruding distal end portion of the identification mark 70.

As illustrated in FIG. 3, the element body 20 includes the diffusion layer 90. Note that, in FIG. 2, the diffusion layer 90 is not illustrated. The diffusion layer 90 is formed at an interface portion of the base material 29 of the element body 20 with the identification mark 70. The interface portion of the base material 29 of the element body 20 with the identification mark 70 is a portion including an interface with the identification mark 70 of the base material 29 and the vicinity of the interface in the base material 29.

The diffusion layer 90 is a layer in which the composition of the element body 20 is changed by a substance diffused from the identification mark 70 (substance constituting the identification mark 70). For example, in a firing step in a manufacturing process of the ceramic electronic component 10, alumina, which is a substance constituting the identification mark 70, diffuses into the base material 29 of the element body 20. The composition of the material constituting the base material 29 is changed by the diffused alumina. Specifically, a proportion of alumina at the interface portion between the base material 29 and the identification mark 70 is higher than a proportion of alumina at a portion other than the interface portion of the base material 29. A portion where the proportion of alumina is higher (an interface portion of the base material 29 with the identification mark 70) is the diffusion layer 90. Note that, in FIG. 3, the diffusion layer 90 is illustrated to have a constant thickness, but a thickness of the diffusion layer 90 may vary.

As illustrated in FIG. 3, the base material 29 of the element body 20 includes the first layer 291 and the second layer 292.

The second layer 292 is formed on an opposite side of the identification mark 70 with respect to the diffusion layer 90, and is in contact with the diffusion layer 90. That is, the diffusion layer 90 is interposed between the second layer 292 and the identification mark 70.

The first layer 291 is formed on an opposite side of the diffusion layer 90 and the identification mark 70 with respect to the second layer 292, and is in contact with the second layer 292. That is, the second layer 292 is interposed between the identification mark 70 and the first layer 291.

As described above, the element body 20 contains celsian. That is, each of the first layer 291 and the second layer 292 provided on the base material 29 of the element body 20 contains celsian. A proportion of celsian contained in the second layer 292 is lower than a proportion of celsian contained in the first layer 291.

In the present embodiment, a proportion of celsian contained in the base materials 21 to 28 other than the base material 29 is lower than the proportion of celsian contained in the first layer 291. In the present embodiment, the base materials 21 to 28 correspond to the first layer similarly to the first layer 291. Here, the internal electrode 49 is interposed between the base materials 28 and 29. The internal electrode 49 restricts the second layer 292 of the base material 29 (that is, a region having a lower proportion of celsian than that of the first layer 291) from reaching the base material 28 corresponding to the first layer. In other words, the internal electrode 49 functions as a barrier that restricts excessive expansion of the second layer 292.

A thickness T1 of the second layer 292 is the same as a maximum thickness T2 of the identification mark 70. Here, the thickness T1 of the second layer 292 is, for example, a maximum thickness of the second layer 292 or an average thickness of the second layer 292. In the present embodiment, the thickness T1 of the second layer 292 is the same regardless of the position as illustrated in FIG. 3. In the present embodiment, the identification mark 70 becomes deeper in the thickness direction 100 from the outer edge portion 70A toward the central portion as viewed in the thickness direction 100. That is, in the present embodiment, the maximum thickness T2 of the identification mark 70 is the thickness of the central portion of the identification mark 70. A position corresponding to the maximum thickness T2 of the identification mark 70 is different depending on the shape and configuration of the identification mark 70.

The thickness T1 of the second layer 292 and the maximum thickness T2 of the identification mark 70 may not be completely the same. For example, in the process of manufacturing the ceramic electronic component 10, in a case where the thickness of the second layer 292 has a slight variation for each position, a difference of the variation is generated between the thickness T1 and the maximum thickness T2. In this case, the thickness T1 is substantially the same as the maximum thickness T2.

As illustrated in FIG. 2, the plating layer 80 covers the external electrode 50. The plating layer 80 suppresses the influence of atmosphere, moisture, and the like on the external electrode 50. The plating layer 80 is a film containing, for example, Ni (nickel)-Sn (tin), Ni (nickel)-electroless Au (gold), or the like. In the present embodiment, the plating layer 80 includes an inner layer 81 containing nickel and an outer layer 82 containing gold. The inner layer 81 is formed on the surface of the external electrode 50. The outer layer 82 is formed on the inner layer 81 on a side opposite to the external electrode 50.

In the present embodiment, the plating layer 80 includes the two layers (the inner layer 81 and the outer layer 82), but the plating layer 80 may include one layer or three or more layers.

According to the present embodiment, the proportion of celsian contained in the second layer 292 close to the identification mark 70 is lower than the proportion of celsian contained in the first layer 291 away from the identification mark 70. As a result, in the present embodiment, the sinterability of the identification mark 70 with respect to the element body 20 can be maintained at a high level as compared with an embodiment in which the element body 20 does not have the second layer 292. Furthermore, since the sinterability of the identification mark 70 with respect to the element body 20 is maintained at a high level, the visibility of the identification mark 70 with respect to the element body 20 is improved.

According to the present embodiment, the identification mark 70 contains alumina as a main material. Here, at the interface with alumina in the element body 20 and the peripheral portion thereof, celsian is less likely to be crystallized. Therefore, when the identification mark 70 containing alumina as a main material is formed on the surface of the element body 20 containing celsian, and the element body 20 is fired together with the identification mark 70, the density of celsian in the peripheral portion of the identification mark 70 in the element body 20 is lower than the density of celsian in other portions other than the peripheral portion in the element body 20. The peripheral portion corresponds to the second layer 292, and the other portions correspond to the first layer 291. That is, according to the present embodiment, the element body 20 including the first layer 291 and the second layer 292 can be easily manufactured.

In a case where the thickness of the second layer 292 is smaller than the maximum thickness T2 of the identification mark 70, that is, in a case where a portion of the identification mark 70 contributing to the improvement of the sinterability with respect to the second layer 292 is thin, there is a possibility that the sinterability of the identification mark 70 with respect to the second layer 292 is deteriorated. In a case where the thickness of the second layer 292 is larger than the maximum thickness T2 of the identification mark 70, that is, in a case where the volume of the portion where the proportion of celsian is low is large, the proportion of celsian in the entire element body 20 decreases, and there is a possibility that the mechanical properties, electrical insulation, and the like of the ceramic electronic component 10 decrease. According to the present embodiment, the thickness of the first layer 291 is the same as or substantially the same as the maximum thickness T2 of the identification mark 70. As a result, it is possible to suppress a decrease in the proportion of celsian in the entire element body 20 while suppressing a decrease in the sinterability of the identification mark 70 with respect to the second layer 292.

According to the present embodiment, in a case where the second layer 292 is formed in the manufacturing process of the element body 20, excessive expansion of the formation range of the second layer 292 can be prevented by the internal electrode 49.

<Method of Manufacturing Ceramic Electronic Component According to Present Embodiment>

Figure 4:
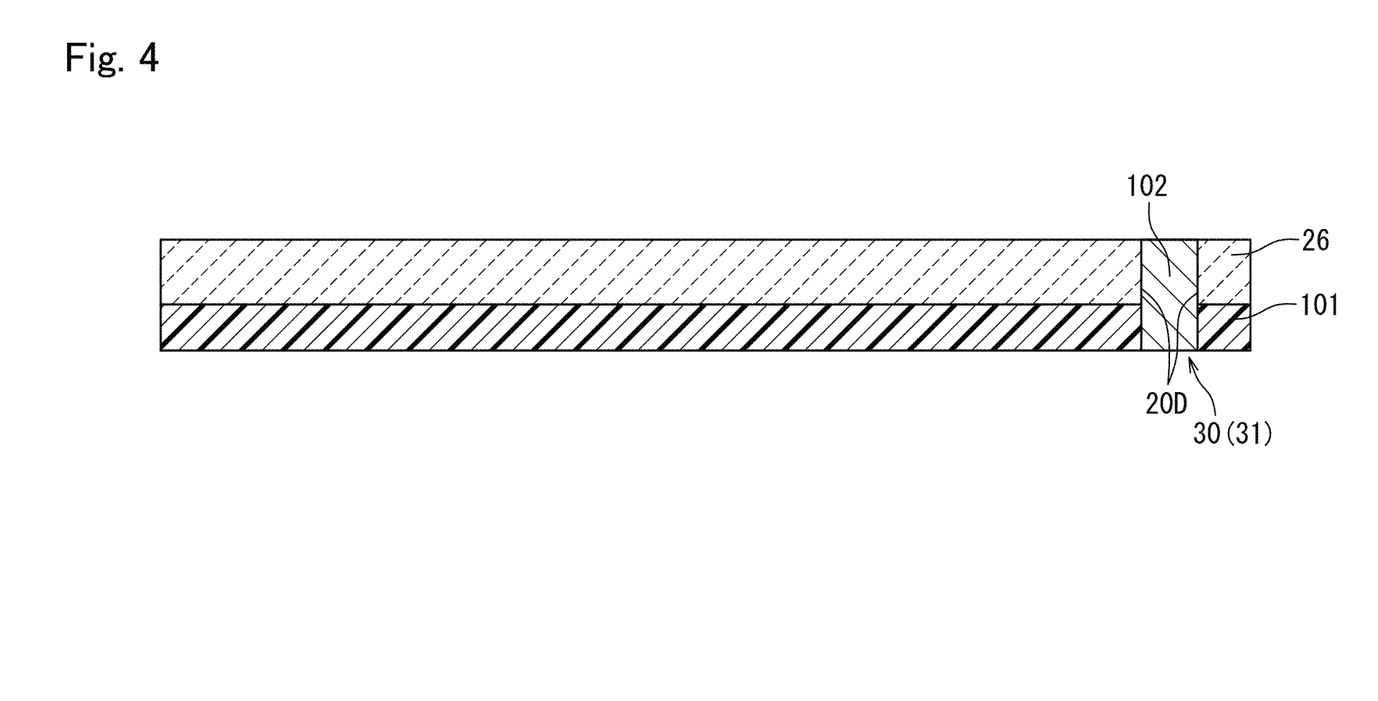
FIG. 4 is a cross-sectional view when an interlayer connection conductor is formed on a base material in a process of manufacturing the ceramic electronic component according to the embodiment of the present description.
Figure 5:
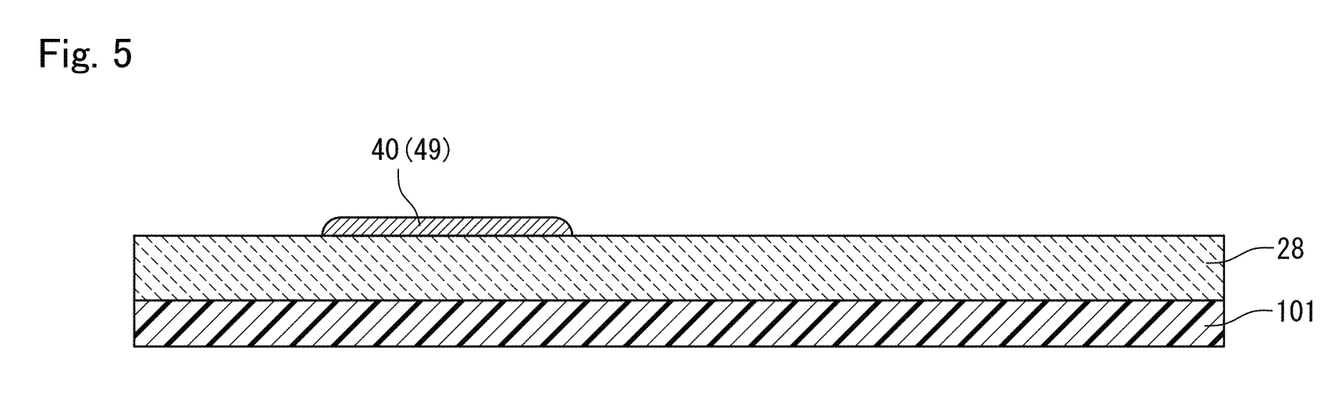
FIG. 5 is a cross-sectional view when an internal electrode is printed on the base material in the process of manufacturing the ceramic electronic component according to the embodiment of the present description.
Figure 6:
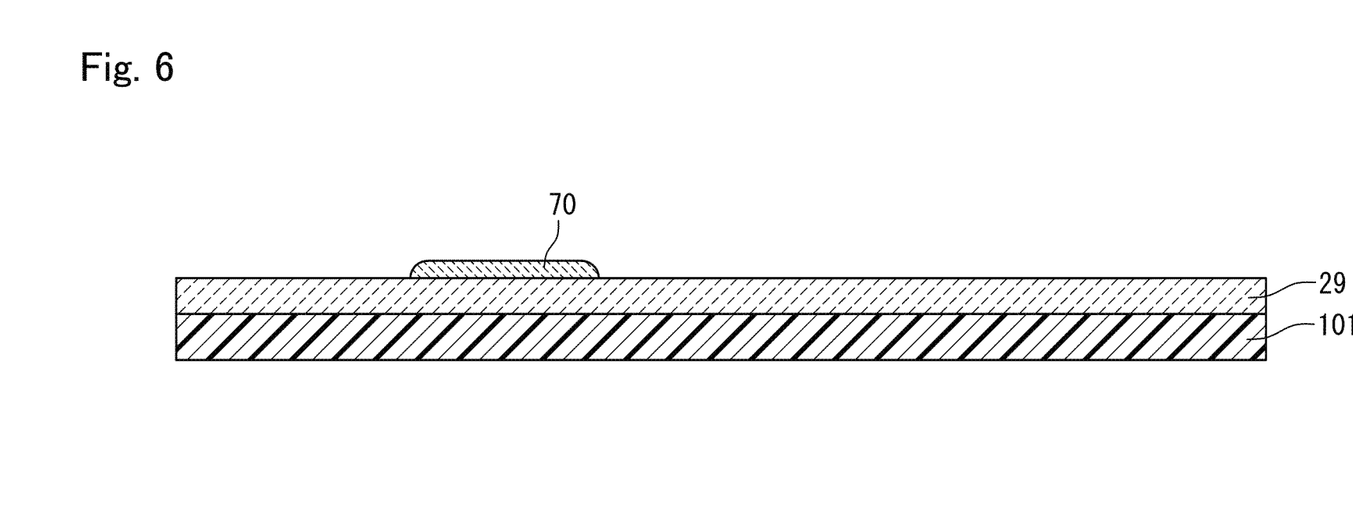
FIG. 6 is a cross-sectional view when an identification mark is printed on the base material in the process of manufacturing the ceramic electronic component according to the embodiment of the present description.
Figure 7:
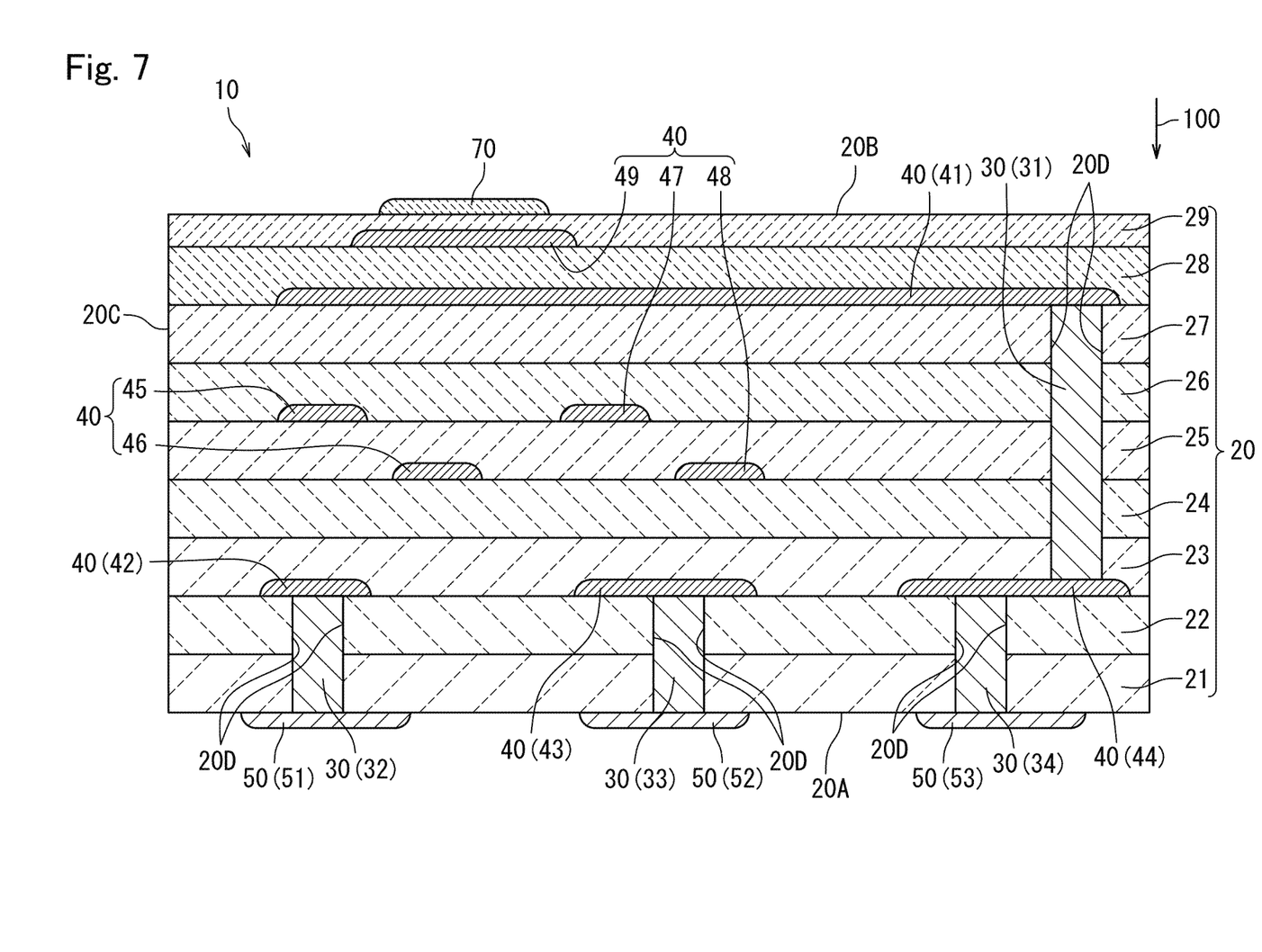
FIG. 7 is a cross-sectional view when a plurality of the base materials are laminated to form an element body in the process of manufacturing the ceramic electronic component according to the embodiment of the present description.
Figure 8:
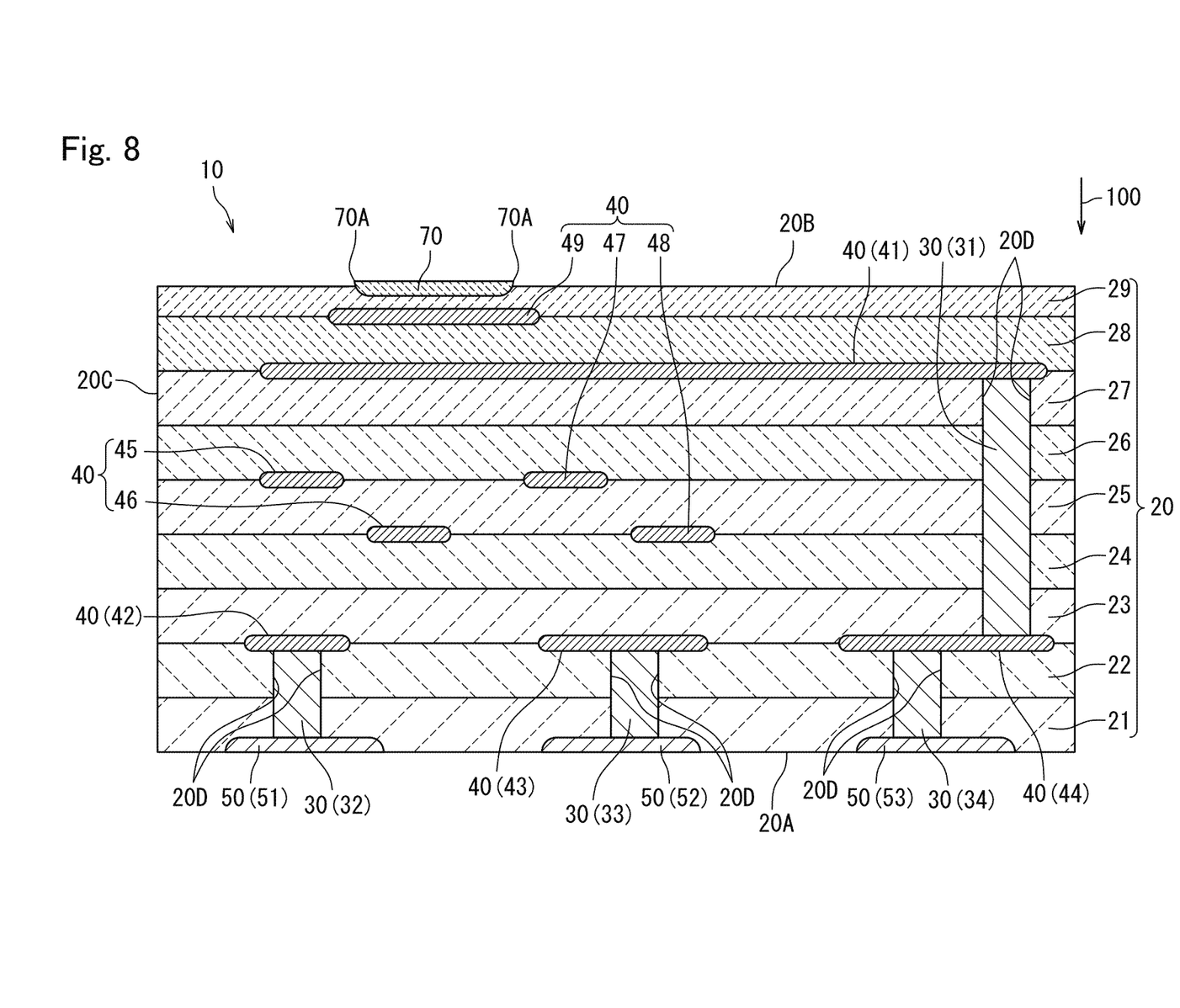
FIG. 8 is a cross-sectional view when the element body is crimped in the process of manufacturing the ceramic electronic component according to the embodiment of the present description.

Hereinafter, an example of a method of manufacturing the ceramic electronic component 10 according to the present embodiment will be described with reference to FIGS. 4 to 8. FIG. 4 is a cross-sectional view when an interlayer connection conductor is formed on a base material in a process of manufacturing the ceramic electronic component according to the embodiment of the present description. FIG. 5 is a cross-sectional view when an internal electrode is printed on the base material in the process of manufacturing the ceramic electronic component according to the embodiment of the present description. FIG. 6 is a cross-sectional view when an identification mark is printed on the base material in the process of manufacturing the ceramic electronic component according to the embodiment of the present description. FIG. 7 is a cross-sectional view when a plurality of the base materials are laminated to form an element body in the process of manufacturing the ceramic electronic component according to the embodiment of the present description. FIG. 8 is a cross-sectional view when the element body is crimped in the process of manufacturing the ceramic electronic component according to the embodiment of the present description.

The ceramic electronic component 10 is manufactured by segmenting a laminate into a plurality of element bodies 20. The laminate is formed by integrating the plurality of element bodies 20 in an arranged state. In FIGS. 4 to 8, for convenience of description, only a portion corresponding to one element body 20 of the laminate is illustrated. A method of manufacturing the ceramic electronic component 10 according to the present embodiment includes a sheet forming step, an interlayer connection conductor forming step, an electrode forming step, an identification mark forming step, an element body forming step, a crimping step, a segmenting step, a firing step, and a plating layer laminating step.

(Sheet Forming Step)

First, the sheet forming step is executed. In the sheet forming step, the base materials 21 to 29 illustrated in FIG. 2 are individually formed. In the base materials 21 to 29 formed in the sheet forming step, raw materials including a main agent, a plasticizer, a binder, and the like corresponding to each of the base materials 21 to 29 are mixed to prepare a slurry constituting each of the base materials 21 to 29. Each of the base materials 21 to 29 at this stage is a green sheet including the slurry.

For each of the base materials 21 to 29, for example, a sinterable ceramic powder or the like is used as the main agent. As the plasticizer, for example, phthalic acid ester, di-n-butyl phthalate, or the like is used. As the binder, for example, an acrylic resin, polyvinyl butyral, or the like is used.

The slurry constituting each of the base materials 21 to 29 is formed into a sheet shape on a carrier film 101 illustrated in FIG. 4 using, for example, a lip coater, a doctor blade, or the like. That is, each of the nine base materials 21 to 29 is formed on each of the nine carrier films 101. As the carrier film 101, for example, a polyethylene terephthalate (PET) film or the like is used. A thickness of each of the base materials 21 to 29 is, for example, 5 to 100 (μm).

FIG. 4 illustrates the carrier film 101 and the base material 26 formed on the carrier film 101.

Next, the through hole 20D penetrating each of the base materials 21 to 29 and the carrier film 101 in the thickness direction is formed.

Note that, in FIG. 4, one through hole 20D is formed in the base material 27 and the carrier film 101, but the number of through holes 20D formed in each of the base materials 21 to 29 is not limited to one. Furthermore, the number of through holes 20D formed in the base materials 21 to 29 and the number of through holes 20D formed in the carrier film 101 corresponding to each of the base materials 21 to 29 may be the same or different. Furthermore, the positions of the through holes 20D formed in the base materials 21 to 29 and the carrier film 101 corresponding to each of the base materials 21 to 29 may be the same position or different positions.

In the method of manufacturing the ceramic electronic component 10 according to the present embodiment, the number and positions of the through holes 20D formed in the nine base materials 21 to 29 and carrier films 101 are determined so that the element body 20 as illustrated in FIG. 2 is finally formed.

(Interlayer Connection Conductor Forming Step)

Next, the interlayer connection conductor forming step is executed. In the interlayer connection conductor forming step, the conductive paste 102 is filled in the through hole 20D formed in each of the base materials 21 to 29 and the carrier films 101 in the sheet forming step (see FIG. 4). The paste 102 filled in the through hole 20D corresponds to the interlayer connection conductor 30.

The paste 102 is prepared, for example, by mixing raw materials containing a conductive powder, a plasticizer, and a binder.

(Electrode Forming Step)

Next, the electrode forming step is executed. In the electrode forming step, the internal electrode 40 and the external electrode 50 are formed.

In the method of manufacturing the ceramic electronic component 10 according to the present embodiment, for example, as illustrated in FIG. 5, a paste corresponding to the internal electrode 49 is formed on the principal surface of the base material 28. The paste is formed by, for example, screen printing, inkjet printing, gravure printing, or the like. Note that other internal electrodes 40 (internal electrodes 42 to 48) and external electrodes 50 are also formed on each of the base materials 21 to 29 in the same manner as the internal electrode 41.

The paste corresponding to the internal electrodes 40 and the external electrodes 50 is prepared by mainly mixing raw materials containing a conductive powder, a plasticizer, and a binder, similarly to the paste 102 described above. Note that the paste corresponding to the internal electrodes 40 and the external electrodes 50 may be constituted of the same raw material as the paste 102, or may be constituted of a raw material different from the paste 102.

(Identification Mark Forming Step)

Next, the identification mark forming step is executed. In the identification mark formation step, the identification mark 70 is formed.

In the method of manufacturing the ceramic electronic component 10 according to the present embodiment, as illustrated in FIG. 6, a paste corresponding to the identification mark 70 is formed on the principal surface of the base material 29. The paste corresponding to the identification mark 70 is formed by, for example, screen printing, inkjet printing, gravure printing, a transfer method described later, or the like. The paste corresponding to the identification mark 70 contains a material (alumina and glass material in the present manufacturing method) constituting the identification mark 70 described above. As described above, the material of the identification mark 70 is arbitrary. For example, in a case where the identification mark 70 includes a conductive material, the paste corresponding to the identification mark 70 is a conductive paste, and in a case where the identification mark 70 does not include a conductive material, the paste corresponding to the identification mark 70 is a non-conductive paste. In the present manufacturing process, a thermal shrinkage rate of the material constituting the identification mark 70 is lower than a thermal shrinkage rate of the material constituting at least the base material 29 among the base materials 21 to 29.

(Element Body Forming Step)

Next, the element body forming step is executed. In the element body forming step, as illustrated in FIG. 7, the base materials 21 to 29 excluding the carrier films 101 are laminated. As a result, the element body 20 is obtained.

In the element body forming step, the nine base materials 21 to 29 are laminated in the order from a base material having a small numerical value to a base material having a large numerical value, specifically, in the order of base materials 21, 22, 23, 24, 25, 26, 27, 28, and 29. As a result, the principal surface of the base material 21 becomes the principal surface 20A of the element body 20, and the principal surface of the base material 29 becomes the principal surface 20B of the element body 20. Furthermore, the side surface of the base materials 21 to 29 becomes the side surface 20C of the element body 20.

In the present embodiment, some of the nine base materials 21 to 29 are inverted and laminated with respect to base materials other than the some of the nine base materials 21 to 29. In the example illustrated in FIG. 7, the base materials 22 to 29 are laminated with the surface on a side of the carrier film 101 facing downward in the drawing, while the base material 21 is laminated with the surface on the side of the carrier film 101 facing upward in the drawing. As a result, as illustrated in FIG. 7, each of the internal electrodes 40 and the identification mark 70 formed on the base materials 22, 24, 25, 27, 28, and 29 is located above each of the base materials 22, 24, 25, 27, 28, and 29, and the external electrodes 50 formed on the base material 21 is located below the base material 21.

(Crimping Step)

Next, the crimping step is executed. In the crimping step, the laminated base materials 21 to 29 are crimped in a mold.

As illustrated in FIG. 8, when each of the base materials 21 to 29 is crimped, the internal electrodes 40 enter the base materials 22, 24, 25, 27, and 28, the external electrodes 50 enter the base material 21, and the identification mark 70 enters the base material 29. As a result, the identification mark 70 is embedded in the element body 20.

Note that the crimping step may not be executed. In this case, the identification mark 70 is not embedded in the element body 20.

(Segmenting Step)

Next, the segmenting step is performed. In the segmenting step, the laminate in which the plurality of element bodies 20 are arranged is cut into the plurality of element bodies 20. For cutting the laminate, for example, a dicing saw, a guillotine cutter, a laser, or the like is used. After the laminate is cut, a corner portion and an edge portion of the element body 20 may be polished by, for example, barrel processing or the like (see FIG. 2). The polishing may be performed after the firing step.

(Firing Step)

Next, the firing step is executed. In the firing step, the element body 20 is fired. As a result, each of the base materials 21 to 29 constituting the element body 20 is cured. That is, each of the base materials 21 to 29, which is a flexible green sheet, is cured and transformed into a substrate (see FIG. 2).

As described above, the thermal shrinkage rate of the material constituting the identification mark 70 is lower than the thermal shrinkage rate of the material constituting the base material 29. Therefore, in the firing step, an amount of shrinkage of the identification mark 70 is smaller than an amount of shrinkage of the base material 29. Therefore, shrinkage of the base material 29 toward the identification mark 70 is inhibited by the outer edge portion 70A (see FIG. 8) of the identification mark 70. As a result, the base material 29 rises in the vicinity of the outer edge portion 70A. A portion where the base material 29 is raised is the first portion 61 (see FIGS. 1 and 3).

Furthermore, in the firing step, the alumina contained in the identification mark 70 is diffused into the base material 29 to form the diffusion layer 90.

Furthermore, in the firing step, the celsian is less likely to be crystallized in the peripheral portion of the identification mark 70 in the element body 20 (specifically, in the element body 20, a side opposite to the identification mark 70 with respect to the diffusion layer 90) than in portions other than the peripheral portion in the element body 20. As a result, in the element body 20, the proportion of celsian contained in the peripheral portion is lower than the proportion of celsian contained in portions other than the peripheral portion. The peripheral portion of the element body 20 corresponds to the second layer 292. The portions other than the peripheral portion in the element body 20 correspond to the first layer 291.

(Plating Layer Laminating Step)

Next, the plating layer laminating step is executed. In the plating layer laminating step, the external electrode 50 is subjected to a known plating treatment. As a result, as illustrated in FIG. 2, the plating layer 80 is laminated so as to cover the external electrode 50.

Figure 9:
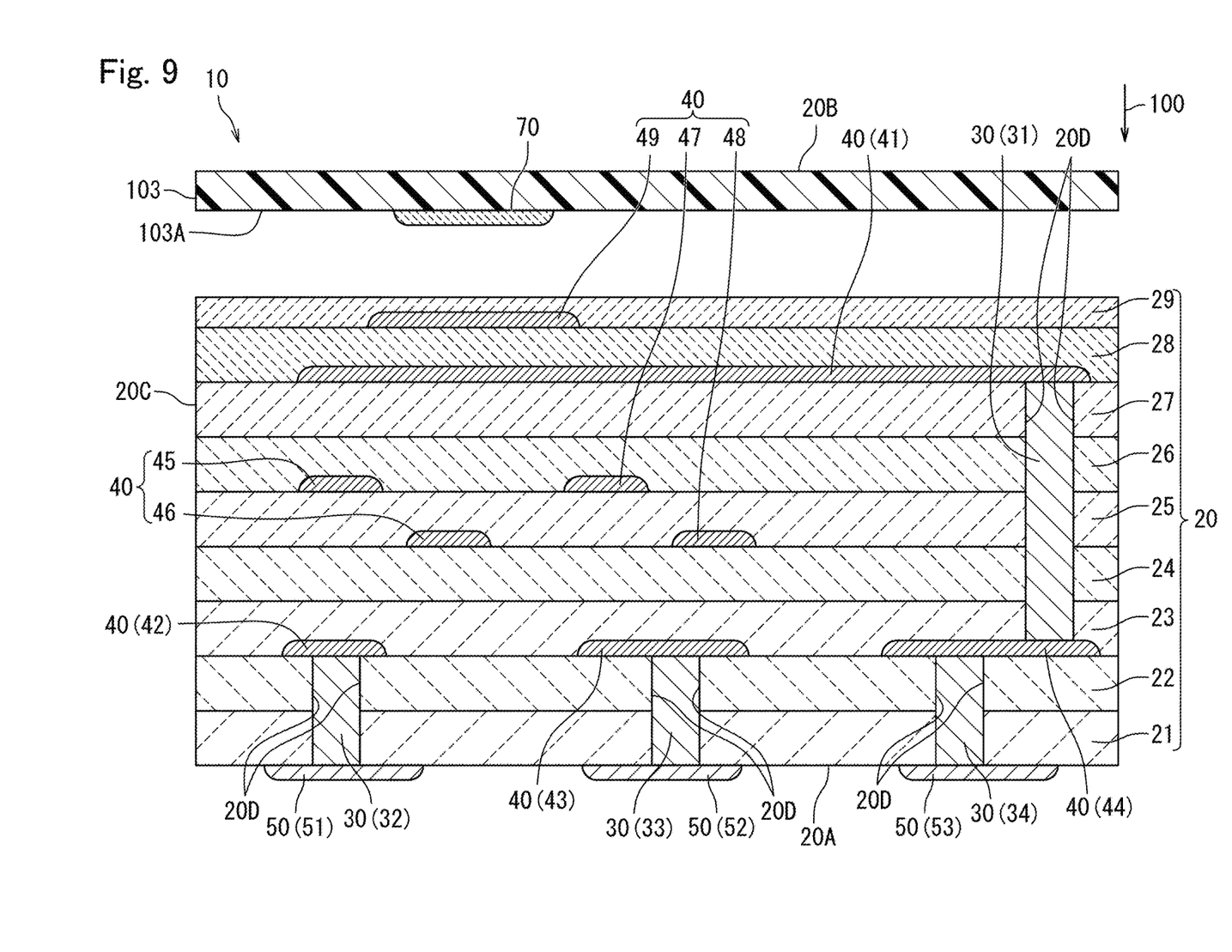
FIG. 9 is a cross-sectional view illustrating a plurality of base materials laminated in a modification of the process of manufacturing the ceramic electronic component according to the embodiment of the present description and a film on which an identification mark is printed.

FIG. 9 is a cross-sectional view illustrating a plurality of base materials laminated in a modification of the process of manufacturing the ceramic electronic component according to the embodiment of the present description and a film on which an identification mark is printed. The identification mark 70 may be formed on the base material 29 by a transfer method.

In the case of the transfer method, as illustrated in FIG. 9, the identification mark 70 is printed on a principal surface 103A of a transfer sheet 103. Thereafter, in the element body forming step, the transfer sheet 103 is laminated on the base material 29 such that the principal surface 103A of the transfer sheet 103 is on a side of the base material 29. As a result, the identification mark 70 is transferred from the transfer sheet 103 to the base material 29 (see FIG. 7).

In the method of manufacturing the ceramic electronic component 10 described above, the first portion 61 is formed in the element body 20 by firing the element body 20 and the identification mark 70 having different thermal shrinkage rates. However, the manufacturing method of forming the first portion 61 is not limited thereto.

For example, before the crimping step, a paste containing a material that burns out by heat is formed in a region excluding the identification mark 70 on the principal surface of the base material 29 and the vicinity of the outer periphery thereof (in other words, a region corresponding to the second portion 62). In the subsequent crimping step, the paste is embedded in the base material 29. In the subsequent firing step, the paste is burned out. As a result, the second portion 62 recessed with respect to a region where the paste is not formed is formed in a region where the paste is formed. That is, in the region where the paste is not formed, the first portion 61 that is raised with respect to the region where the paste is formed is formed.

Note that, by appropriately combining arbitrary embodiments among the various embodiments described above, the effects of the respective embodiments can be achieved.

Although the present description has been fully set forth in connection with the preferred embodiment thereof with reference to the drawings as appropriate, it is to be noted that various changes and modifications are apparent to those skilled in the art. Such changes and modifications are to be understood as included within the scope of the present invention as defined by the appended claims unless they depart therefrom.

EXPLANATION OF REFERENCES 10 ceramic electronic component
20 element body
20B principal surface (surface)
49 internal electrode (electrode)
70 identification mark
291 first layer
292 second layer
T1 thickness
T2 maximum thickness

What is claimed is:

1. A ceramic electronic component comprising:
an element body containing ceramic as a main material thereof; and
an identification mark on a surface of the element body, wherein
the element body comprises:
a first layer containing a specific compound containing barium and silicon; and
a second layer that contains the specific compound, is interposed between the identification mark and the first layer, and has a proportion of the specific compound lower than a proportion of the specific compound in the first layer.

2. The ceramic electronic component according to claim 1, wherein
the element body contains celsian as the main material thereof, and wherein
the identification mark contains alumina as a main material thereof.

3. The ceramic electronic component according to claim 1, wherein a thickness of the second layer is the same as or substantially the same as a maximum thickness of the identification mark.

4. The ceramic electronic component according to claim 1, wherein the element body comprises an electrode interposed between the first layer and the second layer.

5. The ceramic electronic component according to claim 1, wherein the element body contains celsian as the main material thereof.

6. The ceramic electronic component according to claim 1, wherein the element body contains fresnoite as the main material thereof.

7. The ceramic electronic component according to claim 1, wherein a first part of the identification mark is embedded in the element body.

8. The ceramic electronic component according to claim 7, wherein a second part of the identification mark protrudes from the surface of the element body.

9. The ceramic electronic component according to claim 1, wherein a thermal shrinkage rate of the identification mark is lower than a thermal shrinkage rate of the element body.

10. The ceramic electronic component according to claim 1, further comprising a diffusion layer between the element body and the identification mark.

11. The ceramic electronic component according to claim 1, wherein the specific compound is celsian.

* * * * *